(12) United States Patent
Yokota

(10) Patent No.: US 6,573,797 B2
(45) Date of Patent: Jun. 3, 2003

(54) HIGH-FREQUENCY POWER AMPLIFIER

(75) Inventor: Yasuhiro Yokota, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/112,471

(22) Filed: Mar. 28, 2002

(65) Prior Publication Data

US 2002/0135427 A1 Sep. 26, 2002

Related U.S. Application Data

(63) Continuation of application No. PCT/JP99/05399, filed on Sep. 30, 1999.

(51) Int. Cl.[7] .............................................. H03F 3/191
(52) U.S. Cl. ....................................... 330/302; 330/292
(58) Field of Search ................................ 330/144, 302, 330/306, 292; 333/32, 33

(56) References Cited

U.S. PATENT DOCUMENTS 5,159,287 A * 10/1992 Furutani et al. ........ 330/302 X
5,969,575 A * 10/1999 Helms ..................... 330/306 X
6,211,738 B1 * 4/2001 Hecht ......................... 330/292
6,300,827 B1 * 10/2001 King ..................... 330/292 X

FOREIGN PATENT DOCUMENTS

JP 8-321727 12/1996
JP 9-83275 3/1997

* cited by examiner

Primary Examiner—Steven J. Mottola
(74) Attorney, Agent, or Firm—Katten Muchin Zavis Rosenman

(57) ABSTRACT

A high-frequency power amplifier capable of considerably improving the power amplification efficiency ($\eta$). This high-frequency power amplifier 10 comprises an amplifying element 11, an input-side matching circuit 12, and an output-side matching circuit 13, and further has a current absorbing unit 20. This current absorbing unit 20 absorbs the current of a higher-harmonic frequency current contained in a signal of a fundamental wave at which the amplifying element 11 operates. Preferably, this current absorbing unit 20 is comprised of an LC-series resonance circuit 21 having a higher-harmonic frequency as a resonance frequency, and thereby bypasses the above current to the earth.

8 Claims, 17 Drawing Sheets

| r | XL3 | XC3 | 2F | 3F |
|---|---|---|---|---|
| 1.00 | 0.20 | 5.10 | -2.15 | -1.10 |
| 1.00 | 0.30 | 3.60 | -1.20 | -0.30 | ← <3>
| 1.00 | 0.40 | 2.90 | -0.65 | 0.23 |
| 1.00 | 0.50 | 2.50 | -0.25 | 0.67 | ← <2>
| 1.00 | 0.60 | 2.28 | 0.06 | 1.04 |
| 1.00 | 0.70 | 2.13 | 0.34 | 1.39 |
| 1.00 | 0.80 | 2.07 | 0.57 | 1.71 |
| 1.00 | 0.90 | 2.02 | 0.79 | 2.03 |
| 1.00 | 1.00 | 2.00 | 1.00 | 2.33 |

FIG. 6

| BASE INPUT POWER | PRIOR ART | | PRESENT INVENTION | |
|---|---|---|---|---|
| Pi(W) | Po1(W) | η1(%) | Po2(W) | η2(%) |
| 0.60 | 8.00 | 20.00 | 8.80 | 25.00 |
| 1.20 | 14.40 | 25.00 | 15.80 | 33.00 |
| 1.80 | 21.20 | 30.00 | 23.40 | 39.00 |
| 2.40 | 27.20 | 35.00 | 30.20 | 45.00 |
| 3.00 | 32.80 | 39.00 | 36.00 | 50.00 |
| 3.60 | 36.80 | 42.00 | 41.00 | 55.00 |
| 4.20 | 40.40 | 45.00 | 45.00 | 60.00 |
| 4.80 | 43.20 | 47.00 | 48.00 | 65.00 |
| 5.40 | 46.40 | 49.00 | 51.00 | 68.00 |
| 6.00 | 48.80 | 50.00 | 54.00 | 70.00 |

FIG. 10

RECTANGULAR WAVE

HALF SINUSOIDAL WAVE

| | Z | CURRENT OF HALF SINUSOIDAL WAVE | CURRENT OF RECTANGULAR WAVE | REMARK |
|---|---|---|---|---|
| FUNDAMENTAL WAVE | 1.0Ω | 100% | 100% | |
| SECOND HARMONIC | 10Ω | 42.4% | — | THERE IS NO SECOND HARMONIC IN RECTANGULAR WAVE OF DUTY OF 50% |
| THIRD HARMONIC | 19Ω | — | 33.3% | THERE IS NO THIRD HARMONIC IN HALF SINUSOIDAL WAVE |

FIG. 18

HIGH-FREQUENCY POWER AMPLIFIER

CROSS-REFERENCE TO RELATED APPLICATION

This application is a continuation application and is based upon PCT/JP99/05399, filed on Sep. 30, 1999.

TECHNICAL FIELD

The present invention relates to a high-frequency power amplifier, and relates, more particularly, to a class C power amplifier that uses a transistor as an amplifying element.

BACKGROUND ART

Among various kinds of digital modulations that are used for mobile communications or the like, there is a constant amplitude modulation system. In this constant amplitude modulation system, it is possible to use a class C power amplification. As is known well, class C power amplification is a system that has highest power amplification efficiency.

In other words, in general, while class A power amplification efficiency and class B power amplification efficiency are 50% and 70% respectively, class C power amplification efficiency is almost 100%.

However, the above 100% is an ideal value, and an actual value is far from this value. Further, in a high-frequency band of a several 100 MHz or above, to which the present invention refers, this value is much lower, and is about 50%, in reality. Generally known catalogs of amplifiers also show such a low value.

The fact that this power amplification efficiency is as low as about 50% in the high-frequency class C power amplifier has been reported as attributable to internal constants of transistors that form main portions of this amplifier. However, there has been a problem that, because of such low efficiency, the power consumption and the thermal loss of the high-frequency class C power amplifier are large.

DISCLOSURE OF THE INVENTION

In the light of the above problems, a cause of the low power amplification efficiency will be analyzed in the present invention. Further, it is an object of the present invention to provide a high-frequency power amplifier that can increase a realistic value from the conventional value of about 50% to about 70%.

In order to achieve the above object of the present invention, a current absorbing unit which absorbs a higher-harmonic frequency current contained in a signal of a fundamental wave (a fundamental amplification frequency) at which an amplifying element operates, is connected to an input side of the amplifying element.

BRIEF DESCRIPTION OF THE DRAWINGS

The present invention will be explained below with reference to the attached drawings;

FIG. 6 is a diagram that shows concrete numerical values for plotting the graph shown in FIG. 5;

FIG. 10 is a diagram that shows an example of numerical values of power amplification efficiency;

FIG. 18 is a diagram that shows impedances at an L1 side viewed from the terminal J3 of FIG. 16, and magnitude of a current at the terminal J3;

MODE FOR CARRYING OUT THE INVENTION

A general prior art will be explained first, in order to make clear the effects of the present invention.

Figure 12:
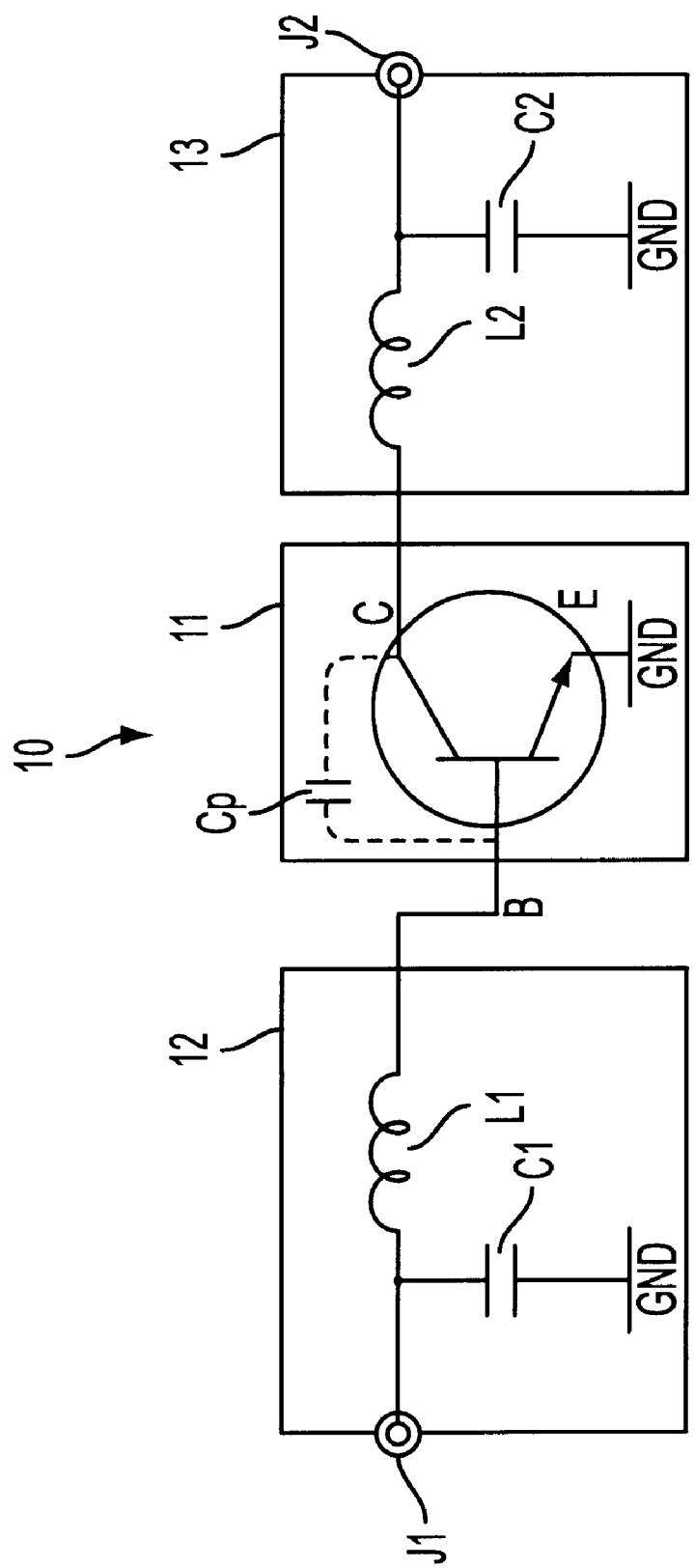
FIG. 12 is a diagram that shows a first example of a conventional high-frequency power amplifier.

FIG. 12 is a diagram that shows a first example of a conventional high-frequency power amplifier.

In this diagram, a reference number 10 denotes a high-frequency power amplifier as a whole, which is mainly comprised of an amplifying element 11, and an input-side matching circuit 12 and an output-side matching circuit 13 that are provided at an input side and an output side of the amplifying element 11, respectively. Note that, in the amplifying element (transistor) 11, B, C, and E denote a base, a collector, and an emitter, respectively, and GND denotes a ground. J1 denotes a signal-source side input terminal that is connected to the signal source (not shown). J2 denotes a load-side output terminal that is connected to a load (not shown).

The power amplifier 10 according to the first prior art example shown in FIG. 12 is called an L type. A connection configuration of a coil L1 and a capacitor C1 that comprise the input-side matching circuit 12 forms an L shape. Further, a connection configuration of a coil L2 and a capacitor C2 that comprise the output-side matching circuit 13 forms an L shape. Incidentally, when a capacitor (not shown) is further connected to between the base B and the ground (GND) in the input-side matching circuit 12, the amplifier 10 becomes a π type.

Figure 13:
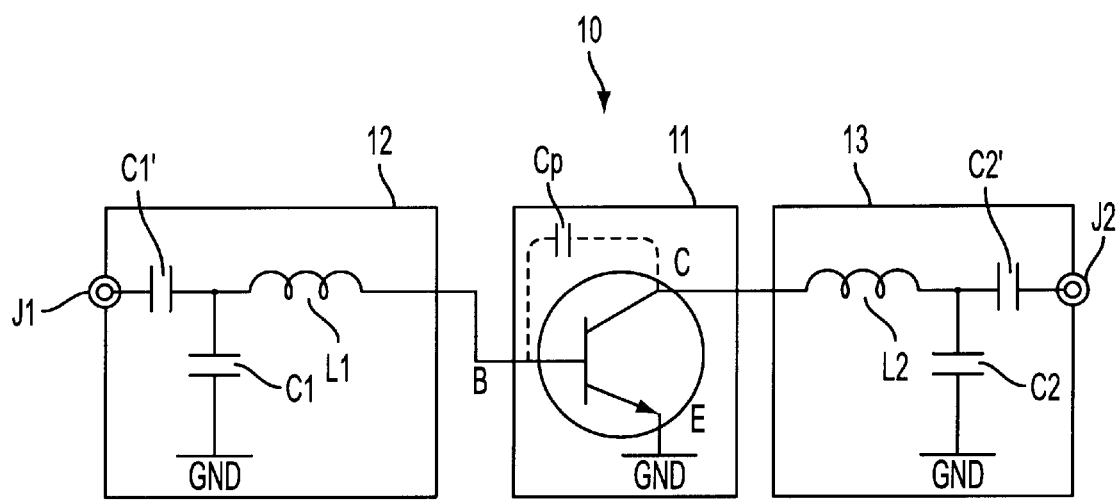
FIG. 13 is a diagram that shows a second example of a conventional high-frequency power amplifier.

FIG. 13 is a diagram that shows a second example of a conventional high-frequency power amplifier. Note that throughout the diagrams, similar constituent elements are assigned the same reference numerals or symbols.

A high-frequency power amplifier 10 shown in FIG. 13 is different from the amplifier 10 shown in FIG. 12 in that the former is called a T type, where a connection configuration of a coil L1 and capacitors C1 and C1' that comprise an input-side matching circuit 12 forms a T shape. Further, a connection configuration of a coil L2 and capacitors C2 and C2' that comprise an output-side matching circuit 13 forms a T shape.

Figure 14:
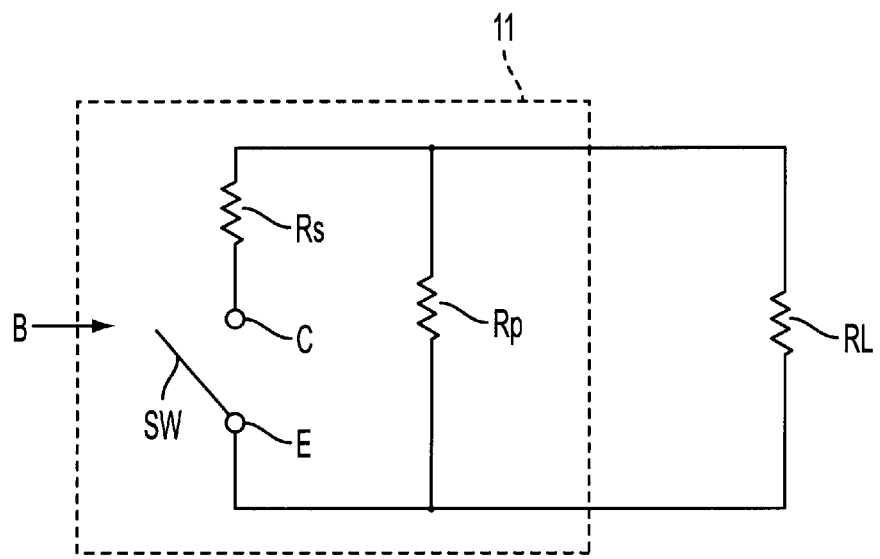
FIG. 14 is an equivalent circuit diagram of an amplifying element 11 shown in FIG. 12 and FIG. 13.

FIG. 14 is an equivalent circuit diagram of the amplifying element 11 shown in FIG. 12 and FIG. 13.

As seen from FIG. 14, the amplifying element 11 operating under the class C power amplification repeats an ON/OFF operation, and thus the amplifying element 11 can be expressed equivalently as a switch SW.

An internal resistance RS of the transistor is further connected in series with this switch SW. A parallel resistance Rp is further added to both the switch SW and the internal resistance RS, which is inherent in the transistor. RL denotes a resistance of the aforesaid load (a load resistance).

Among the above resistances Rs, Rp and RL, the parallel resistance Rp has a larger value than the load resistance RL, and therefore this does not significantly affect the above power amplification efficiency. Note that the power amplification efficiency is defined by Po/Pin. Pin represents input power from a DC power source to the amplifying element 11, and Po represents output power from the amplifying element 11. Here, Pin is defined by Vcc×Ic (where Vcc denotes a voltage of the DC power source, and Ic denotes a collector current of the transistor).

On the other hand, the internal resistance Rs has a smaller value than the series-connected load resistance RL. However, in regard to the relationship with the ON time of the switch SW, the internal resistance Rs has a large influence on the power amplification efficiency (Po/Pin). The inventor of the present invention has analyzed this point in detail.

Figure 15A:
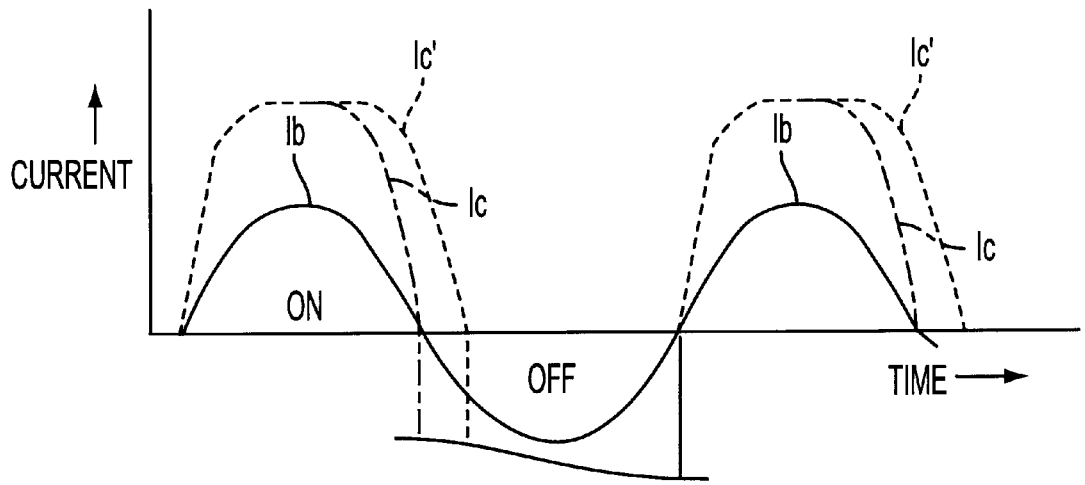
FIG. 15(A) and FIG. 15(B) are graphs used for analyzing conventional problems.
Figure 15B:
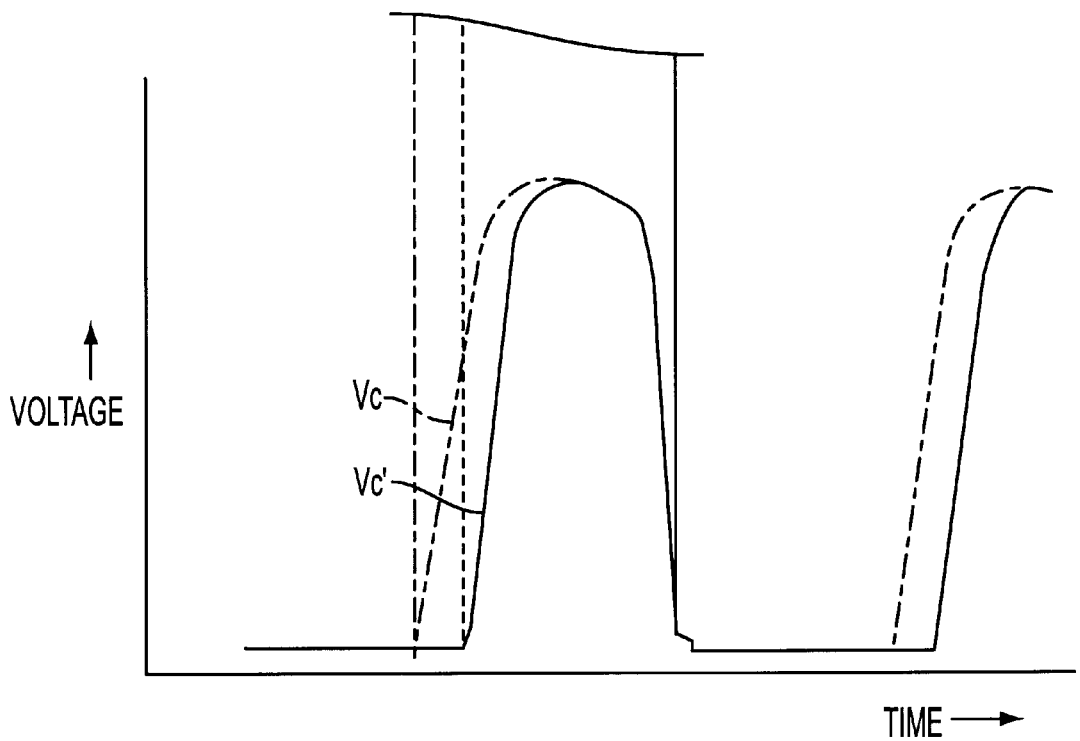

FIG. 15(A) and FIG. 15(B) are graphs used for analyzing the conventional problems.

FIG. 15(A) shows current waveforms of a base current and a collector current of the amplifying element 11, and FIG. 15(B) shows a waveform of a collector voltage of the amplifying element 11.

It is observed that a collector voltage appears as Vc' in FIG. 15(B), when a base current flows as shown by Ib in FIG. 15(A). This is a point to be noted. A collector voltage appears as shown by Vc' (in FIG. 15(B)), when the ON time of the amplifying element 11 (a positive half cycle of the signal source, that is, a time when a positive Ib flows) shifts to the OFF time (a negative half cycle of the signal source, that is, a time when a negative Ib flows). In other words, the switching from positive to negative of Ib does not coincide with the switching (rise) of vc', and thus Vc' is switched (rises) with some delay after the switching of Ib. In principle, the collector voltage should rise substantially at the same timing as the switching of Ib. This ideal collector voltage is shown by Vc in FIG. 15(B). Eventually, the ON time of the amplifying element 11 becomes longer than the originally intended ON time, and therefore the influence of the internal resistance Rs increases by that amount. As a result, the power amplification efficiency does not increase.

As a result of the investigation of the above phenomenon, the inventor of the present invention has presumed as follows. The ideal collector current as shown by Ic in FIG. 15(A) does not flow to the amplifying element 11, and actually, a collector current flows as shown by Ic' in this figure. In other words, actually, the collector current Ic' continues to flow even after the amplifying element 11 has switched into the OFF time (the negative half cycle of the signal source).

Then, the inventor has concluded that a cause of the above continuous flow of Ic' even after the amplifying element 11 has switched into the OFF time resides in the parasitic capacitance between the collector and the base. In other words, the collector current intrinsically is going to flow as Ic, as shown in FIG. 15(A), along with the reduction of the base current Ib. However, the collector current ends up flowing into the base B side through the parasitic capacitance. This flow-in current becomes the base current, flowing into the base B of the amplifying element 11. As a result, this generates the collector current Ic' of the problem.

Although this parasitic capacitance itself is known well, this is graphically depicted as Cp (parasitic) in FIG. 12 and FIG. 13.

The above wraparound of the collector current to the base will be further analyzed with reference to the drawings.

Figure 16:
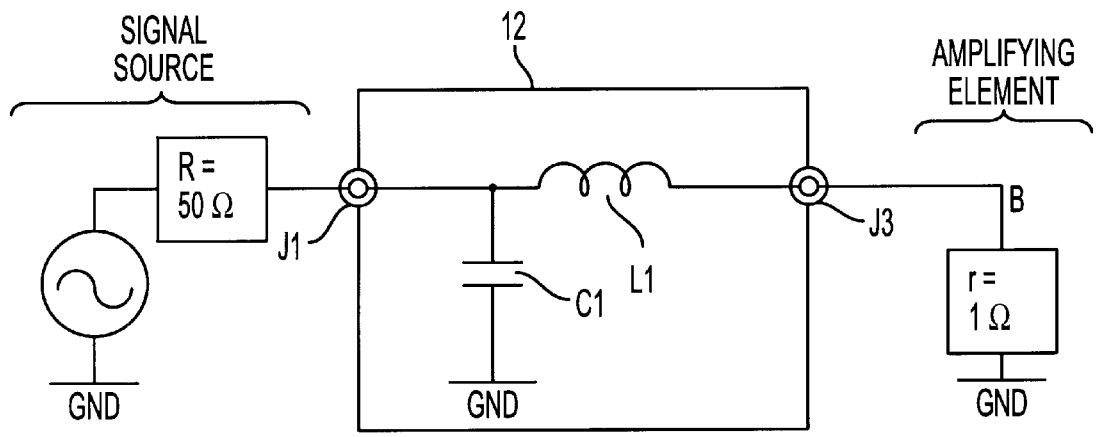
FIG. 16 is a diagram for explaining an impedance conversion at an input-side matching circuit.

FIG. 16 is a diagram for explaining an impedance conversion in an input-side matching circuit.

In this diagram, a signal source is connected to the above signal-source side input terminal J1 of the input-side matching circuit 12 (the structure of FIG. 12 is shown as an example). The impedance (R) of this signal source is 50 Ω. On the other hand, the base B of the amplifying element 11 is connected to a matching output terminal J3 of this circuit 12, and the impedance (input resistance r) of this amplifying element 11 is 1 Ω.

The above matching circuit 12 executes an impedance conversion by the coil L1 and the capacitor C1, so that the matching circuit 12 matches the impedance between r=1 Ω and R=50 Ω. Specifically, when the reactance of the coil and the reactance of the capacitor are XL1 and XC1 (x=jω) respectively, these are $$XL1=\sqrt{R \cdot r}$$

(where, Q>>1)

$$XL1=XC1=7.07 \; \Omega$$

The impedance at the coil L1 side viewed from the base B (output terminal J3) of the amplifying element 11 and the current at the output terminal J3 will be considered with reference to the matching circuit 12 shown in FIG. 16. In this case, not only a fundamental wave of the amplifying element 11 (for example, 300 MHz), but also a second harmonic and a third harmonic of a higher-harmonic frequency derived from the fundamental wave (600 MHz, 900 MHz) will be considered.

Figure 17A:
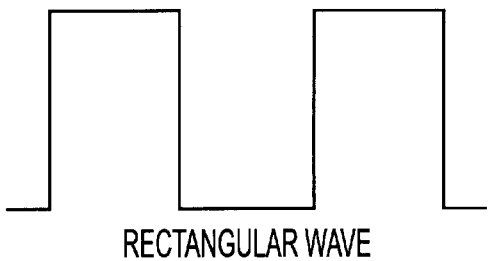
FIG. 17 is a diagram that shows a current waveform of a fundamental wave that flows through a terminal J3 shown in FIG. 16.
Figure 17B:
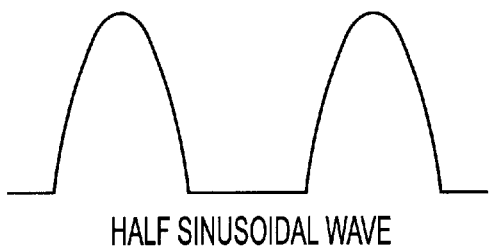

FIG. 17 is a diagram that shows a current waveform of a fundamental wave that flows through the terminal J3 shown in FIG. 16.

In the present waveform diagram, (A) shows a fundamental wave of a rectangular wave, and (B) shows a fundamental wave of a half sinusoidal wave. When class C amplification is carried out, the amplifying element 11 operates as the switch SW that is turned ON/OFF as explained above. Therefore, the rectangular wave shown in FIG. 17(A) appears as the fundamental wave. However, actually, the rectangular wave is distorted because of the influence of peripheral circuits, and this rectangular wave may have a waveform close to the half sinusoidal wave shown in FIG.

17(B). In other words, the above two types of the rectangular wave and the half sinusoidal wave are considered as representative waveforms of the current that flows through the terminal J3.

The impedance viewed from the terminal J3 and the current at the terminal J3 will be considered for the fundamental wave, the second harmonic, and the third harmonic, for the half sinusoidal wave and the rectangular wave, respectively.

FIG. 18 is a diagram that shows the impedance at the L1 side viewed from the terminal J3 of FIG. 16, and the magnitude of a current at the terminal J3.

Referring to this diagram, the impedance Z is 1.0 Ω for the fundamental wave, 10 Ω for the second harmonic, and 19 Ω for the triple harmonic, respectively. On the other hand, for the current of the half sinusoidal wave, a double harmonic exists at 42.4% when a fundamental wave exists at 100%. No odd-order higher harmonic (a triple harmonic) is generated for the half sinusoidal wave. For the current of the rectangular wave, a triple harmonic exists at 33.3% when a fundamental wave exists at 100%. No even-order higher harmonic (a second harmonic) is generated for a rectangular wave having a duty of 50%.

A higher harmonic that exceeds a third harmonic has small energy, and has no influence. Therefore, this is not shown in FIG. 18. what is clear from FIG. 18 is that, first, the currents of a second harmonic and a third harmonic share about thirty to forty percent of the current of the fundamental wave, and a component ratio of these currents is relatively high, Second, the impedance z for the double harmonic-and the triple harmonic is substantially as high as about ten to twenty times the impedance of the fundamental wave.

As explained above, the higher-order harmonic impedance Z of the second harmonic and the third harmonic is very high when the terminal J3 is viewed from the base B of the amplifying element 11. Therefore, the higher-order currents of the second harmonic and the third harmonic wrap around this base B. Further, the current which wraps around the base B also has a very large magnitude as explained above. It is considered that the current that wraps around the base B causes the collector current Ic' in question shown in FIG. 15(A). As a result, it is considered that the power amplification efficiency becomes considerably lower than the theoretical value of 100%, and falls to around 50%.

In this situation, the inventor of the present invention has tried to realize a matching circuit 12 which has a circuit structure suitable for a wide band amplification so as to make the above higher-order harmonic impedance Z substantially small (to reduce the current which wraps around the base B). For example the inventor has tried to make the matching circuit suitable for a wide band by using two-stage or three-stage matching circuit as shown in FIG. 19 and FIG. 20.

Figure 19:
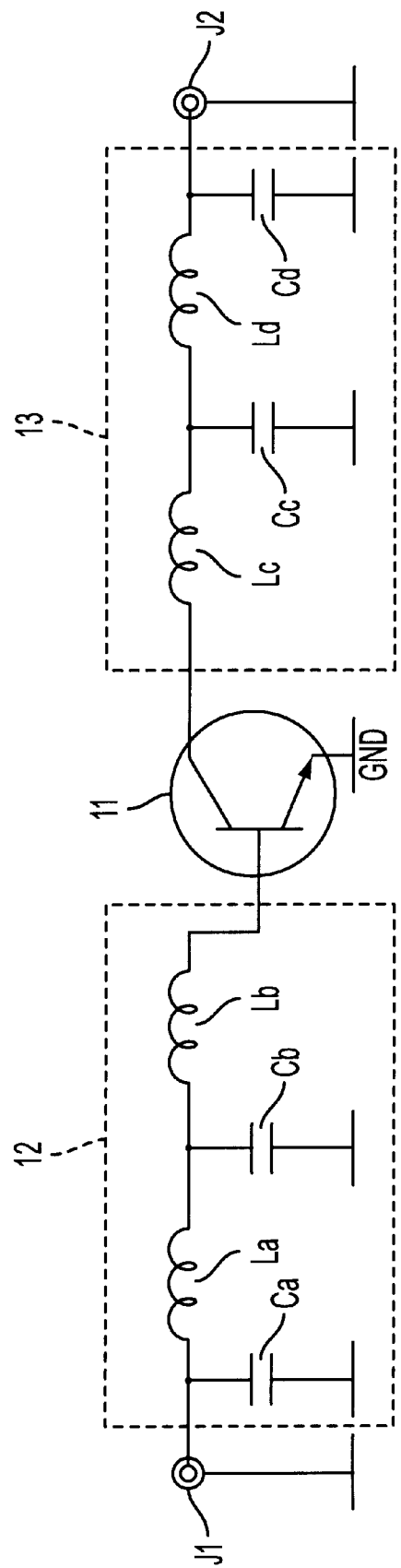
FIG. 19 is a diagram that shows a prior art example using a two-stage matching circuit at both an input side and an output side.

FIG. 19 is a diagram that shows a prior art example in which a two-stage matching circuit is used at both an input side and an output side.

Figure 20:
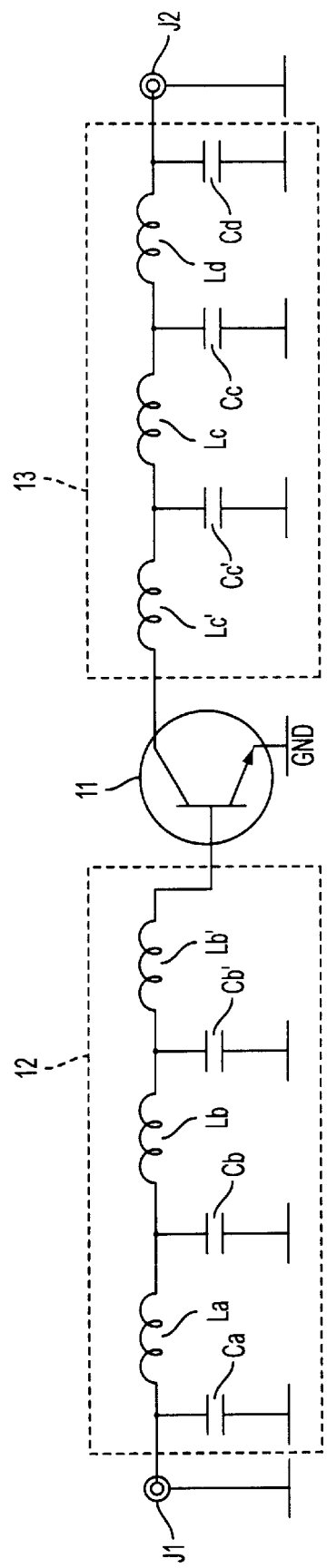
FIG. 20 is a diagram that shows a prior art example using a three-stage matching circuit at both an input side and an output side.

FIG. 20 is a diagram that shows a prior art example in which a three-stage matching circuit is used at both an input side and an output side.

When the above multi-stage matching circuits are used, the impedance viewed from the base B at a higher-harmonic frequency is lowered. However, the level of this reduction is as small as about a few percent, and it has become clear that there is no effect of solving the problem.

The present invention has been made based on the above analysis and investigation and will be explained in detail below.

Figure 1:
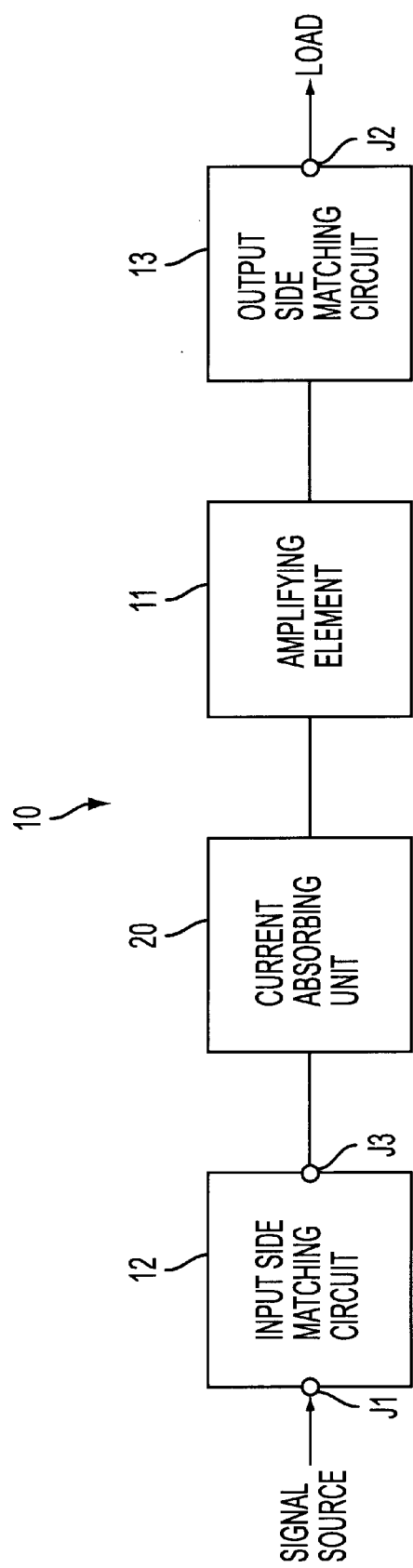
FIG. 1 is a diagram that shows a basic structure of the present invention.

FIG. 1 is a diagram illustrating a basic structure of the present invention.

In FIG. 1, a high-frequency power amplifier 10 according to the present invention basically comprises: an amplifying element 11 for amplifying high-frequency power; an input-side matching circuit 12 which is provided at an input side of the amplifying element 11; and an output-side matching circuit 13 which is provided at an output side of the amplifying element 11.

The present invention is characterized in that it introduces a current absorbing unit 20.

The current absorbing unit 20 is inserted between the input side of the amplifying element 11 and the input-side matching circuit 12, and absorbs a current of higher-harmonic frequency which is contained in a signal of a fundamental wave with which the amplifying element 11 operates. The current of the higher-harmonic frequency is the current of the second harmonic (for example, 600 MHz) or the third harmonic (for example, 900 MHz) which is already explained with reference to FIG. 18 (when the fundamental wave is 300 MHz, for example).

As has been explained above, the flow of the current of the higher-harmonic frequency into the input-side matching circuit 12 is blocked by the high impedance of circuit 12, and thereby the current is going to wrap around the base B of the amplifying element 11, Therefore, according to the present invention, the current absorbing unit 20 selectively absorbs a current of a higher-harmonic frequency, and thus prevents this current from flowing into the base B.

Figure 2:
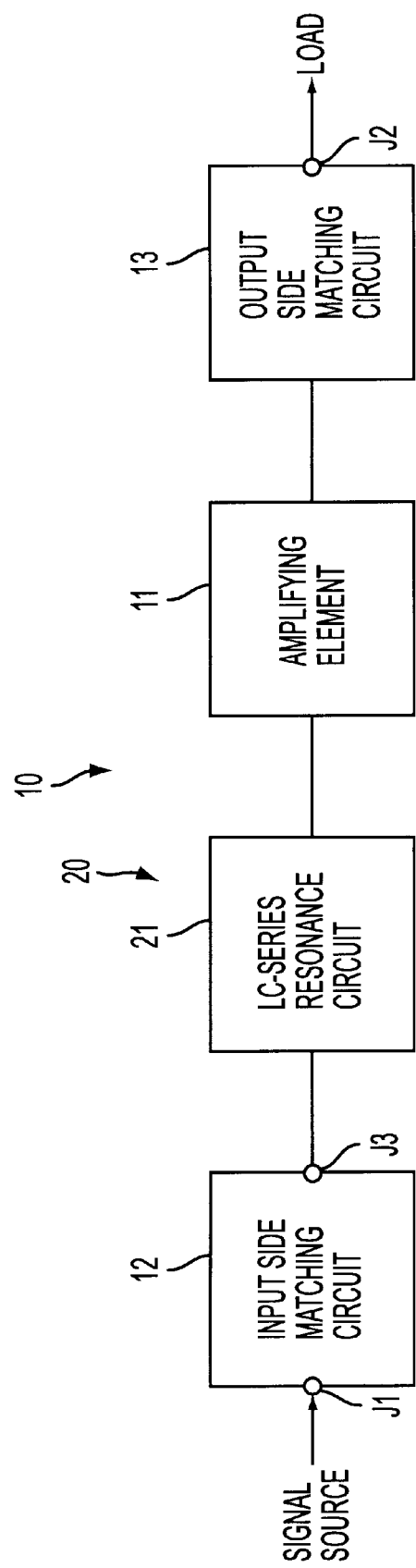
FIG. 2 is a diagram that shows a concrete structure of the present invention.

FIG. 2 is a diagram illustrating a concrete structure of the present invention.

The current absorbing unit 20 shown in FIG. 1 that selectively absorbs a current of higher-harmonic frequency can be practically comprised of an LC-series resonance circuit 21 shown in FIG. 2.

In other words, the current absorbing unit 20 is comprised of the LC-series resonance circuit 21 which has higher-harmonic frequency as a resonance frequency.

Figure 3:
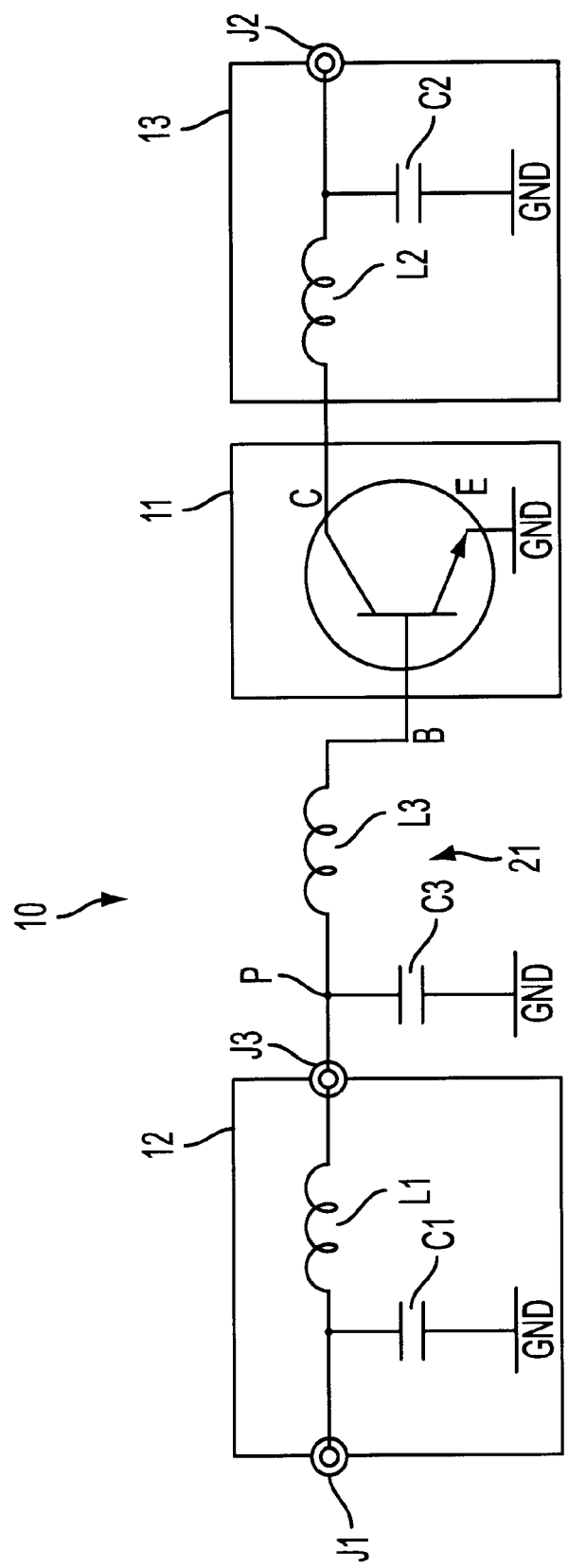
FIG. 3 is a diagram that shows a detailed example of the concrete structure shown in FIG. 2.

FIG. 3 is a diagram that shows a detailed example of the concrete structure shown in FIG. 2.

According to this diagram, the LC-series resonance circuit 21 shown in FIG. 2 is comprised of a coil L3 and a capacitor C3.

In other words, the LC-series resonance circuit 21 is comprised of: the coil L3 which is connected between the input side of the amplifying element 11 and the input-side matching circuit 12; and the capacitor C3 one end of which is connected to a connecting point P thereof, and the other end of C3 is grounded.

A description of a DC power source (a power source voltage Vcc) which is applied from the collector C side will be omitted (this also applies to the following explanation).

Figure 4:
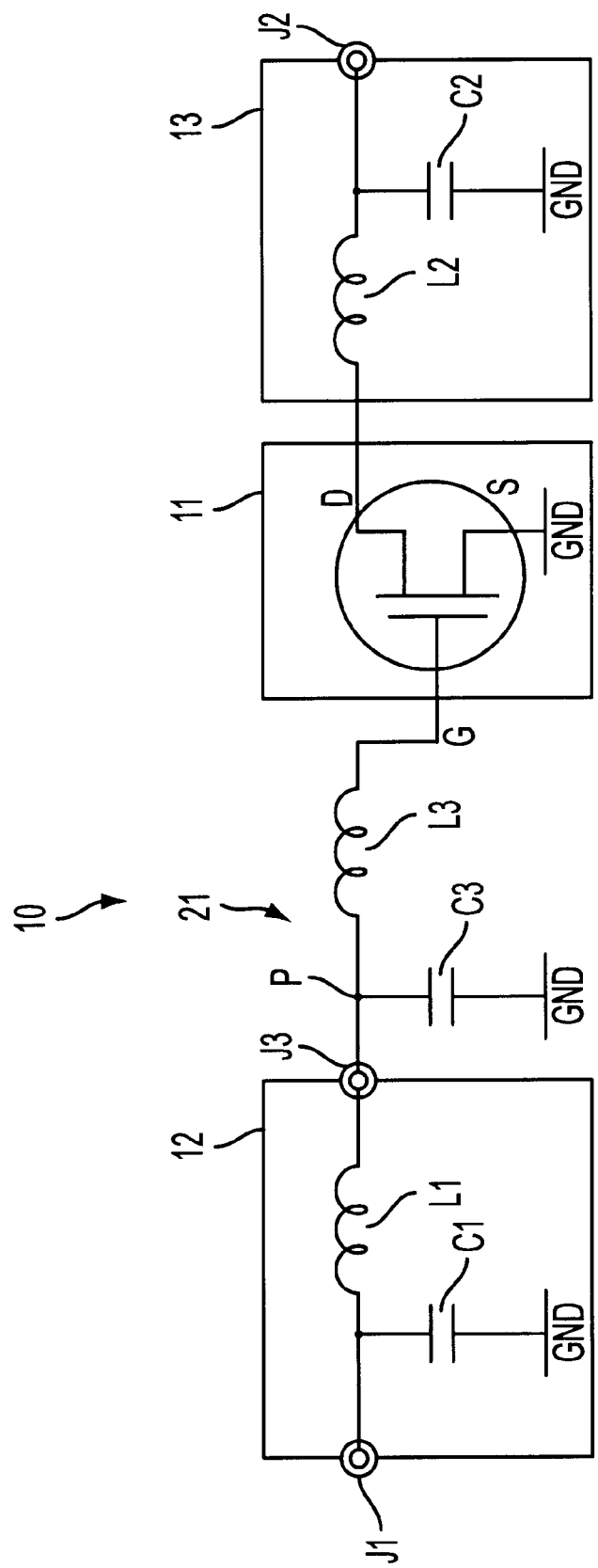
FIG. 4 is a diagram that shows a modification of an amplifying element shown in FIG. 3.

FIG. 4 is a diagram illustrating a modification of the amplifying element shown in FIG. 3.

In FIG. 3, the amplifying element 11 is a transistor which operates under class C power amplification and acts as an emitter-ground transistor. It is also possible to arrange such that this amplifying element 11 is a field-effect transistor which operates under a class C power amplification and acts as a source-grounded field-effect transistor. FIG. 4 shows this structure. In the diagram, G denotes a gate, S denotes a source, and D denotes a drain.

The field-effect transistor also has a parasitic capacitance between the gate and the drain, and the aforementioned conventional problem could occur in this field-effect transistor.

In conclusion, according to the present invention, a current of a higher-harmonic frequency which appears at the input side of the amplifying element 11 does not wrap around the base B, but is bypassed to the earth (GND). As a result, it is possible to obtain the ideal collector current Ic and the ideal collector voltage Vc as shown in FIG. 15(A) and FIG. 15(B). Further, it is possible to change the waveform of the collector current when the transistor is ON, to a waveform close to that of the base current. Therefore, it is possible to substantially improve the power amplification efficiency (as described later).

Next, how to determine the constants of the coil L3 and the capacitor C3 will be explained with reference to FIG. 3.

Figure 5:
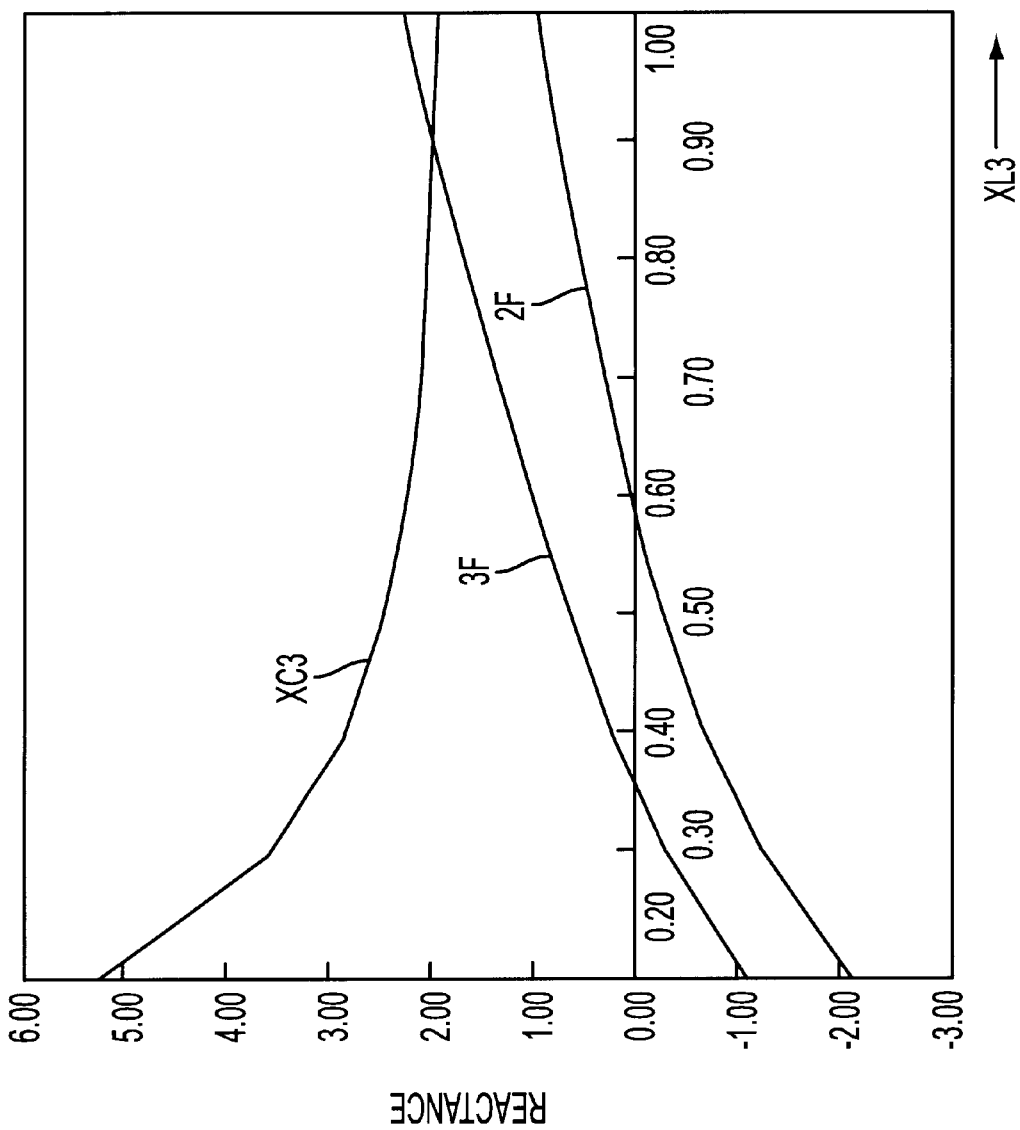
FIG. 5 is a graph that shows one example of how to determine the constants of a coil L3 and a capacitor C3 respectively.

FIG. 5 is a graph depicting one example of how to determine set constants of the coil L3 and the capacitor C3 respectively.

In this graph, a horizontal axis shows a reactance XL3 of the coil L3, and a curve XC3 shows a change in the reactance of the capacitor C3. A vertical axis shows a combined impedance of XL3 and XC3. A curve 2F shows this combined impedance for the above second harmonic frequency, and a curve 3F shows this combined impedance for the above triple harmonic frequency.

The curve XC3 shows values that satisfy a resonant condition, when XL3 is charged to 0.20, 0.30, . . . , respectively in the graph For the third harmonic frequency, the combined impedance changes along with the changes of XL3 and XC3 as shown by the curve 3F of the graph. Therefore, there are many combinations of XL3 and XC3 to be plotted on the curve 3F.

In the present invention, among these above combinations, a combination by which the combined impedance becomes substantially a real part is selected. In this graph, this point is XL=0.35. When XL is at this point, XC3 becomes 3.2. As above, the combination should be selected such that the combined impedance becomes a real part, it becomes easy to design a circuits and this designing becomes practical. Among various points of XL3 possible for determing the constants, it is preferable to select L3 such that XL3 becomes a minimum (excluding zero).

FIG. 6 is a diagram showing concrete numerical values for plotting the graph shown in FIG. 5.

In this diagram, XL3, XC3, 2F, and 3F denote the following. As explained above, XL3 denotes a reactance value of the coil L3, XC3 denotes a reactance value of the capacitor C3, 2F denotes a combined impedance value of XL3 and XC3 at the second harmonic frequency, and 3F denotes a combined impedance value of XL3 and XC3 at the third harmonic frequency. At the left end, r denotes an input resistance value the base B, and r is set as r=1.00 Ω, as shown in FIG. 16.

In FIG. 6, an arrow mark <3> at the right end shows a region in which the combined impedance becomes substantially a real part only at the triple harmonic. An arrow mark <2> shows a region in which the combined impedance becomes substantially a real part only at the second harmonic (2F).

In conclusion, in applying the present invention to the designing, it is preferable to determine the respective constants of the coil L3 and the capacitor C3 so that the input impedance at the input side of the amplifying element 11 after conversion in impedance by the LC-series resonance circuit 21 becomes substantially a real part at the connecting point P. In this case, it is preferable that the constant of the coil L3 is selected from among combinations of a constant of the coil L3 and a constant of the capacitor C3, which satisfy both the condition of the LC series resonance and the condition for becoming the real part and also the constant of the coil L3 becomes the smallest value.

In the above explanation, the determination of the constants of L3 and C3 has been considered by taking only the LC-series resonance circuit 21 into account. In actual practice, it is preferable to determine the constants of L3 and C3 by further taking the coil L1 and the capacitor C1 both forming the input-side matching circuit 12.

To be more specific, it is preferable to determine respective constants of the coil L3 and the capacitor C3 so as to make it possible to attain the impedance matching with the input-side signal source (50 Ω) of the amplifying element 11, by cooperation with both the LC-series resonance circuit 21 and the input-side matching circuit 12. In other words, it is preferable to determine the constants of the LC-series resonance circuit 21 (L3, C3) so as to satisfy both the resonance condition and the impedance matching condition. This will be explained below with reference to the drawings and equations.

Figure 7:
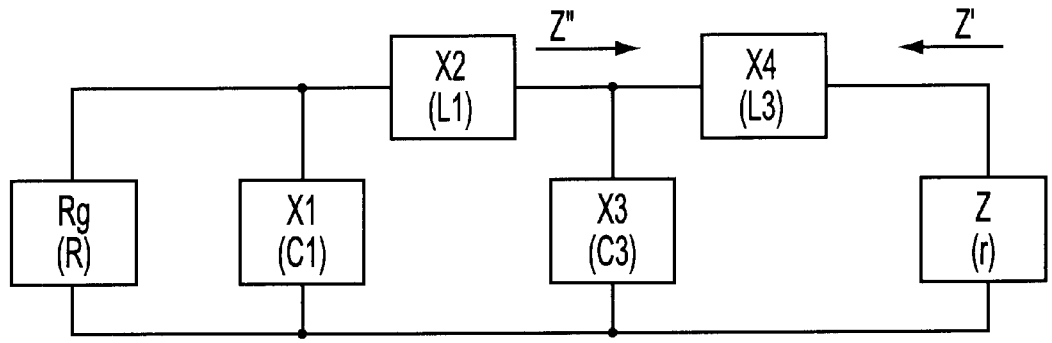
FIG. 7 is a diagram that shows an equivalent circuit viewed from the input side of an amplifying element 11 in FIG. 3.

FIG. 7 is a diagram illustrating an equivalent circuit viewed from the input side of an amplifying element 11 in FIG. 3.

In this diagram, X1 and X2 denote the reactances of the capacitor C1 and the coil L1 respectively both constituting the input-side matching circuit 12. X3 and X4 denote reactances of the capacitor C3 and the coil L3, respectively, and both constitute the LC-series resonance circuit 21. Rg denotes the impedance of the signal source, Z denotes the input impedance of the base B, and these correspond to R=50 Ω and r=1 Ω shown in FIG. 16 respectively.

In FIG. 7, Z' represents a combined impedance at the signal source (Rg) side viewed from the base B. Z" represents a combined impedance at L3 (X4), C3 (X3) and r (Z) viewed from L1 (X2).

The following equation (1) satisfies a matching condition between Rg and Z.

$$Rg = \left( \cfrac{1}{\cfrac{1}{\left(\cfrac{1}{\cfrac{1}{Z+X4}+\cfrac{1}{X3}}\right)+X2} + \cfrac{1}{X1}} \right) \quad (1)$$

Next, as to Z', Z' provides a conjugate impedance relative to Z at the fundamental wave frequency. The following equation (2) satisfies a resonant condition of a series resonance at a higher-harmonic frequency (a second harmonic, a third harmonic, or an intermediate frequency between the double harmonic and the triple harmonic).

$$Z' = \left( \cfrac{1}{\cfrac{1}{\left(\cfrac{1}{\cfrac{1}{Rg}+\cfrac{1}{X1}}\right)+X2} + \cfrac{1}{X3}} \right) + X4 \quad (2)$$

Values of X1 to X4 that satisfy the above equation (1) and the equation (2), in addition the value of X4 (L3) becomes the smallest, are determined.

Further, values of X1 to X4 that make the above Z" substantially a real part are determined. Then Z" can be expressed by the following equation (3).

$$Z'' = \left(\cfrac{1}{\left(\cfrac{1}{Z+X4} + \cfrac{1}{X3}\right)}\right) \quad (3)$$

The signal of a higher-harmonic frequency to be taken note of is not limited to a double harmonic or a triple harmonic of a fundamental wave, but this signal may be an intermediate wave between the second harmonic and the third harmonic. If it is desired to suppress mainly the influence of the second harmonic (42.4%) of the half sinusoidal wave shown in FIG. 18, the higher-harmonic frequency to be taken note of is set as a second harmonic frequency. If it is desired to suppress mainly the influence of the third harmonic (33.3%), the higher-harmonic frequency to be taken note of is set as a triple harmonic frequency. Further, if it is desired to suppress mainly the influence of both the second harmonic of the half sinusoidal wave and the third harmonic of the rectangular wave, the higher-harmonic frequency to be taken note of is set as an intermediate frequency between the second harmonic and the third harmonic.

While the above high-frequency power amplifier has been explained as an amplifier of a concentrated constant circuit, it may also be a high-frequency power amplifier of a distributed constant circuit in which a part or the whole of the coil L and the capacitor C are comprised of microstrip lines. The power amplifier according to this microstrip line will be explained below.

Figure 8:
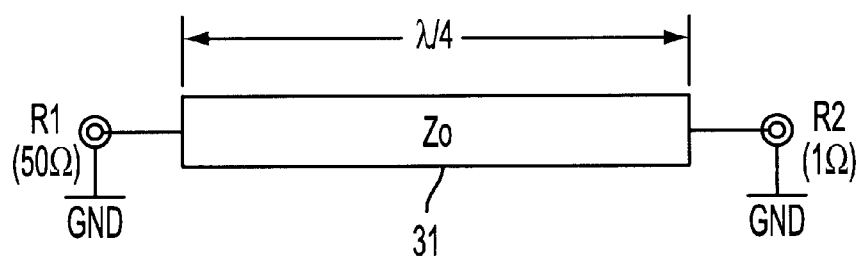
FIG. 8 is a diagram for explaining a general impedance conversion by a microstrip line.

FIG. 8 is a diagram for explaining a general impedance conversion based on a microstrip line.

However, this diagram is for explaining the fact that the impedance conversion based on the microstrip line cannot be applied to the present invention.

The impedance conversion based on the microstrip line is as follows.

A relationship between an impedance conversion ratio according to a microstrip line 31 and a characteristic impedance $Z_0$ is given by the following equation (6).

$$Z_0 = \sqrt{R1 \cdot R2} \quad (6)$$

According to this equation, when R1 is 50 Ω and R2 is 1 Ω, for example, $Z_0$ becomes 7 Ω. However, in this case, the line length becomes λ/4 at the fundamental wave, and λ/2 at the second harmonic frequency respectively. Therefore, it is not possible to achieve the impedance conversion. In other words, only 50 Ω can be viewed from the R2 side, and it is not possible to attain a series resonance between the R2 side terminal and the earth (GND). As a result, it is not possible to apply the general impedance conversion method to the present invention.

Figure 9:
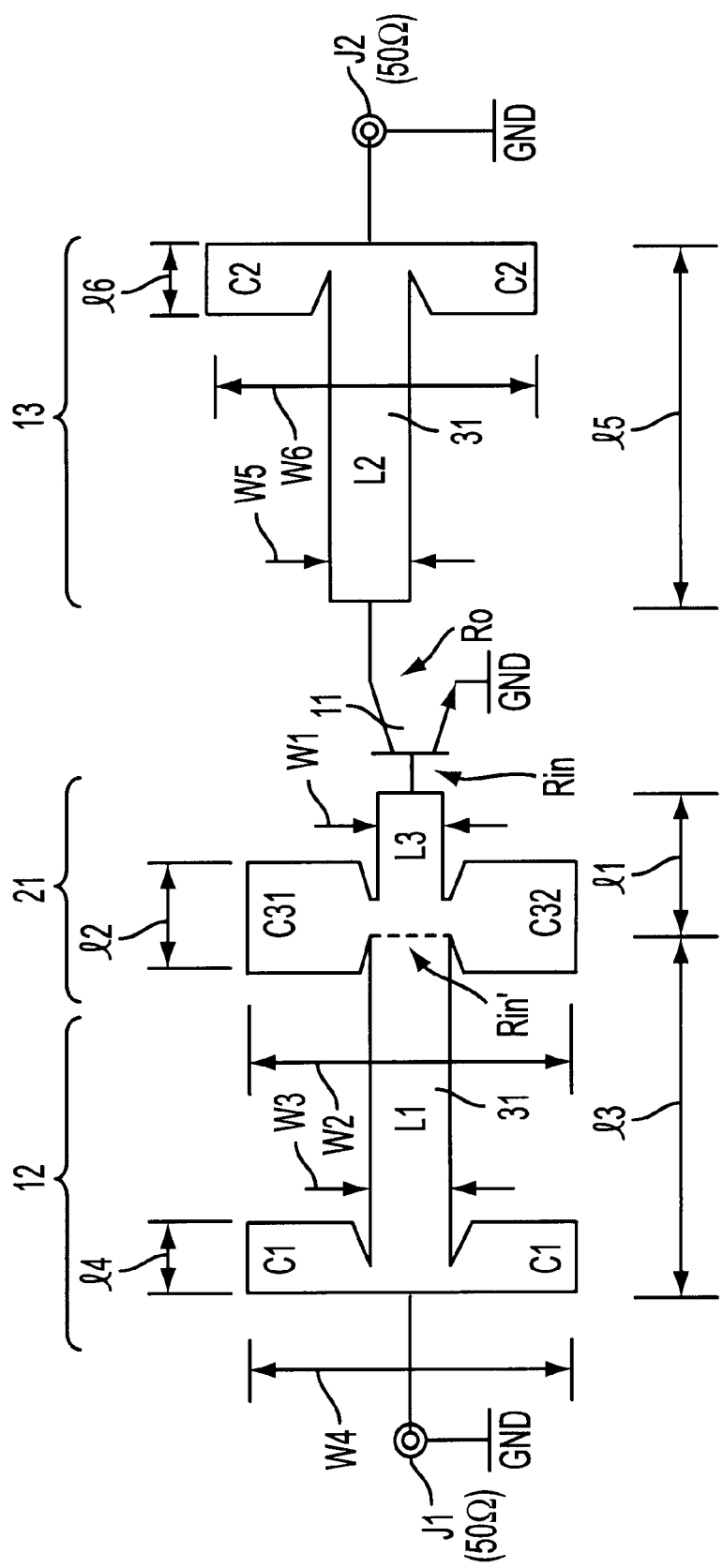
FIG. 9 is a diagram that shows a circuit structure with a microstrip line that is employed in the present invention.

FIG. 9 is a diagram illustrating a circuit structure, employed in the present invention, using microstrip lines.

The structure of this diagram is illustrated by one to one correspondence to the structure of FIG. 3, and corresponding constituent elements are assigned with the same reference numbers or symbols.

An actual form of a circuit to be connected with the transistor 11 will be explained with reference to FIG. 9.

L3 and C3 (C31+C32) at the input side of the transistor are made by strip lines. In this case, the L and C made by the strip lines are obtained from the following equations (7) and (8).

$$L = (Z_0 * 1)/(f * \lambda g) \quad (7)$$

$$C = 1/(Z_0' * f * \lambda g) \quad (8)$$

$Z_0$ and $Z_0'$ are characteristic impedances that are determined based on the width (W) of the line, the thickness of an insulation layer on which the lines are wired and the dielectric constant of the insulation layer. Further, l denotes a length of the line, and λg denotes a wavelength determined by taking a propagation speed on the line into account.

At the input side of the transistor 11, there are provided L3 that has sizes of W1 and l1, and C3 that has sizes of W2 and l2. L3 and C3 (C31+C32) are set to satisfy a condition that a series resonance is attained at a higher-harmonic frequency and to obtain a real number (Rin') when viewed from the L1 side.

Further, in order to convert the resistance (Rin') obtained through the impedance conversion of Rin by L3 and C3, to 50 Ω, there are also formed L1 that has sizes of W3 and l3, and C1 that has sizes of W4 and l4, in a manner similar to that explained above.

At the output side of the transistor 11, in order to achieve an impedance conversion between the output impedance Ro and 50 Ω, there are also formed L2 that has sizes of W5 and l5, and C2 that has sizes of W6 and l6, in a manner similar to that explained above.

Last, an actual example of numerical values that clarify the improvement of the power amplification efficiency (Po/Pin) according to the present invention will be shown.

FIG. 10 is a diagram showing an example of numerical values of the power amplification efficiency.

Figure 11:
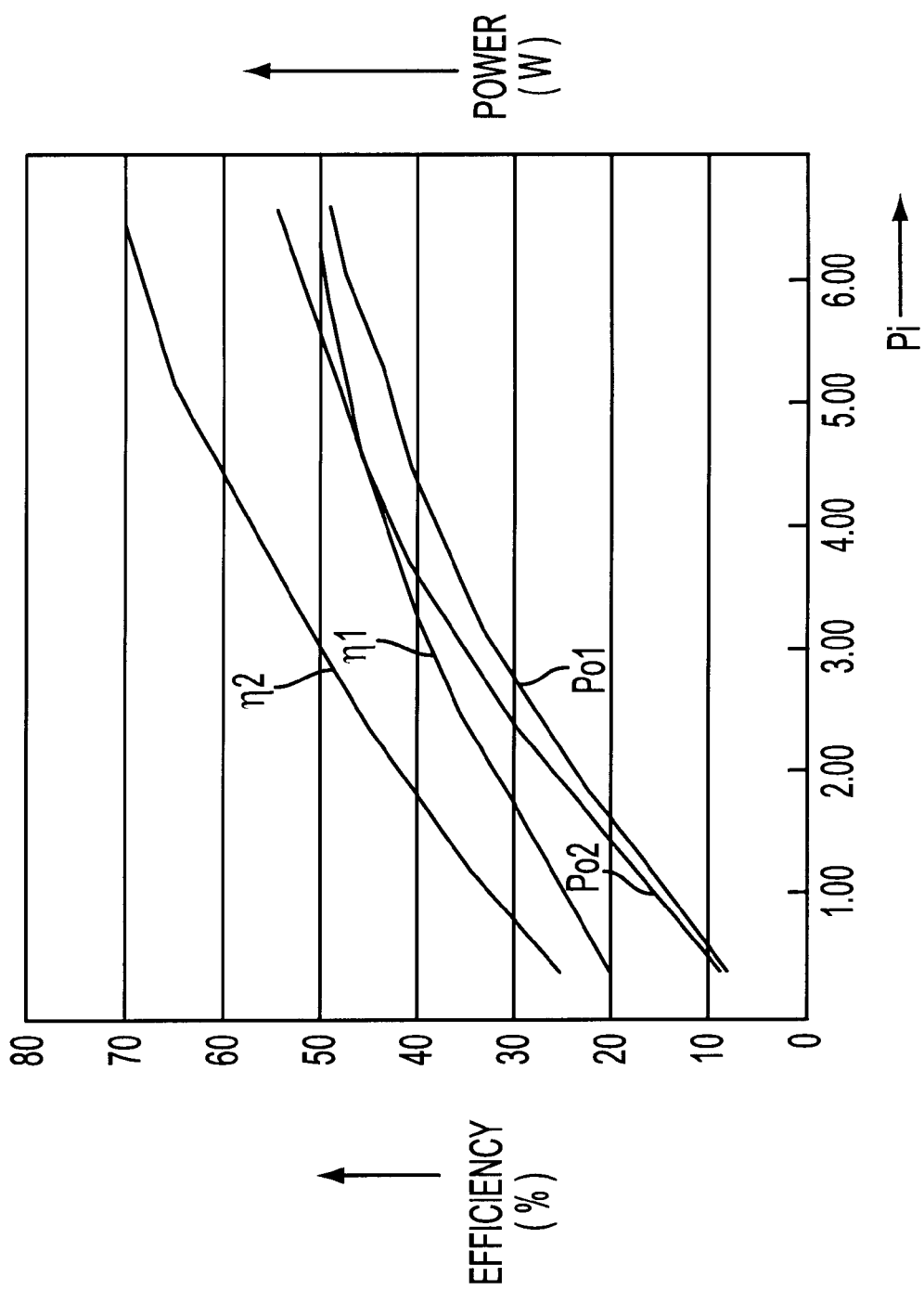
FIG. 11 is a graph that is obtained by plotting the numerical data of FIG. 10.

Further, FIG. 11 is a graph obtained by plotting the numerical data of FIG. 10.

In these diagrams, symbols represent the following meanings.

Pi: input power to the base of the transistor

Po 1: output power of a prior art example

η1: power amplification efficiency of a prior art example

Po 2: output power of the present invention

η2: power amplification efficiency of the present invention

η1=Po 1/Pin, and η2=Po 2/Pin. Further, Pin=Vcc×Ic (already explained). The values of Pin are omitted.

Particularly, it can be understood from the graph in FIG. 11 that, while the power amplification efficiency η1 is about 50% at maximum in the prior art example, it is possible to increase this efficiency to about 70% according to the power amplification efficiency η2 of the present invention.

As explained in detail above, according to the present invention, the cause of low-level power amplification efficiency, such as about 50%, in the conventional high-frequency power amplifier has been investigated, and this problem has been solved efficiently. As a result, it has become possible to remarkably increase the power amplification efficiency to about 70%.

What is claimed is:

1. A high-frequency power amplifier comprising: an amplifying element for amplifying high-frequency power; an input-side matching circuit being provided at an input side of the amplifying element; and an output-side matching circuit being provided at an output side of the amplifying element, wherein the high-frequency power amplifier has a current absorbing unit which is inserted between the input side of the amplifying element and the input-side matching circuit, and absorbs a current of a higher-harmonic frequency contained in a signal of a fundamental wave with which the amplifying element operates, wherein said current absorbing unit includes an LC-series resonance circuit having a higher-harmonic frequency as a resonance frequency, an inductive reactance (XL) being connected at a connection point between the input side of said amplifying element and said input-side matching circuit and a capacitive reactance (XC) one end of which is connected to the above connection point and the other end of which is grounded, and whereby said LC-series resonance circuit absorbs current of the higher-harmonic frequency flowing into the input side of said amplifying element through a parasitic capacitance from the output side of the amplifying element.

2. The high-frequency power amplifier as set forth in claim 1, wherein the constant of each of the coil L and the capacitor C is determined respectively such that an input impedance at the input side of the amplifying element after conversion in impedance by the LC-series resonance circuit becomes substantially a real part at the connecting point.

3. The high-frequency power amplifier as set forth in claim 2, wherein the constant of said coil L is selected from among combinations of a constant of the coil L and a constant of said capacitor, which satisfy both the condition of the LC series resonance and the condition for becoming the real part and also the constant of the coil L becomes the smallest value.

4. The high-frequency power amplifier as set forth in claim 2, wherein the constants of said coil L and said capacitor C are determined so as to make it possible to attain the impedance matching with the input-side signal source of said amplifying element, by cooperation with both said LC-series resonance circuit and said input-side matching circuit.

5. The high-frequency power amplifier as set forth in claim 1, wherein the higher-harmonic frequency is a second harmonic or a third harmonic of a fundamental wave, or an intermediate-wave frequency between the second harmonic and the third harmonic.

6. The high-frequency power amplifier as set forth in claim 1, wherein said amplifying element is a transistor operating under a class C power amplification and acting as an emitter-ground transistor.

7. The high-frequency power amplifier as set forth in claim 1, wherein said amplifying element is a field-effect transistor operating under a class C power amplification and acting as a source-grounded field-effect transistor.

8. The high-frequency power amplifier as set forth in claim 1, wherein a part or the whole of said coil L and said capacitor C is comprised of microstrip lines forming a distributed constant circuit as the high-frequency power amplifier.

* * * * *